United States Patent
Nagabushnam et al.

[11] Patent Number: 6,012,970
[45] Date of Patent: Jan. 11, 2000

[54] PROCESS FOR FORMING A SEMICONDUCTOR DEVICE

[75] Inventors: Rajan Nagabushnam; Subramoney V. Iyer, both of Austin, Tex.

[73] Assignee: Motorola, Inc., Schaumburg, Ill.

[21] Appl. No.: 08/783,975

[22] Filed: Jan. 15, 1997

[51] Int. Cl.[7] .................................................. B24B 1/00
[52] U.S. Cl. .............................. 451/41; 451/59; 451/285
[58] Field of Search ................... 451/41, 36, 59, 451/63, 285, 287, 288, 289

[56] References Cited

U.S. PATENT DOCUMENTS

| | | | |
|---|---|---|---|
| 5,020,283 | 6/1991 | Tuttle | 51/209 DL |
| 5,216,843 | 6/1993 | Breivogel et al. | 51/131.1 |
| 5,329,734 | 7/1994 | Yu | 51/283 R |
| 5,435,772 | 7/1995 | Yu | 451/63 |
| 5,441,598 | 8/1995 | Yu et al. | 156/645.1 |
| 5,449,314 | 9/1995 | Meikle et al. | 451/41 |
| 5,558,563 | 9/1996 | Cote et al. | 451/41 |

FOREIGN PATENT DOCUMENTS 3-213265  9/1991  Japan .

*Primary Examiner*—Eileen P. Morgan
*Attorney, Agent, or Firm*—George R. Meyer

[57] ABSTRACT

Vibrating and oscillating rates can be dynamically changed during polishing to achieve an optimal polishing process. A semiconductor device substrate (34) has a first layer with a first film (12) and a second film (10) that overlies the first film (12), where the first film (12) is harder and underlies the second film (10). In one embodiment, the substrate (34) is placed over a first region (66) of a polishing pad (60). The second film (10) is polished at a first vibrating and oscillating rates over the first region (66). An endpoint signal is received when the first film (12) is reached. The substrate (34) is moved to a second region (62) of the polishing pad (60) that is closer to the edge of the pad and has a higher feature density compared to the first region (66). Polishing is performed at a second vibrating and oscillating rates that are different from the first vibrating and oscillating rates to remove the first film (10).

8 Claims, 3 Drawing Sheets

6,012,970

PROCESS FOR FORMING A SEMICONDUCTOR DEVICE

FIELD OF THE INVENTION

This invention relates in general to processes for forming semiconductor devices, and more particularly, processes for polishing semiconductor device substrates using a polishing pad with features.

BACKGROUND OF THE INVENTION

Currently, device density within integrated circuits requires critical dimensions of approximately 0.5 microns and smaller. At these dimensions, chemical-mechanical polishing (CMP) is virtually required for planarizing insulating layers or making conductive plugs. In the prior art, center-to-edge nonuniformity problems occur during CMP. Typically, the polishing rate is less near the center of the wafer compared to the edge of the wafer.

In an attempt to improve the center-to-edge uniformity, a number of different styles of polishing pads have been proposed. Some of these prior pads are in U.S. Pat. Nos. 5,441,598 (Yu) and 5,020,283 (Tuttle). These patents include a changing feature density across the surface of the polishing pad. Even with these different styles of polishing pads, problems with center-to-edge nonuniformity can still exist. Therefore, a need exists to further improve center-to-edge uniformity for CMP processes.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION OF THE DRAWINGS

Vibrating and oscillating rates can be dynamically changed during polishing to achieve an optimal polishing process. A semiconductor device substrate has a first layer with a first film and a second film that overlies the first film, where the first film is harder and underlies the second film. In one embodiment, the substrate is placed over a first region of a polishing pad. The second film is polished at a first vibrating and oscillating rates over the first region. An endpoint signal is received when the first film is reached. The substrate is moved to a second region of the polishing pad that is closer to the edge of the pad and has a higher feature density compared to the first region. Polishing is performed at a second vibrating and oscillating rates that are different from the first vibrating and oscillating rates to remove the first film. The polishing processes allow for better control compared to prior art methods.

Figure 1:
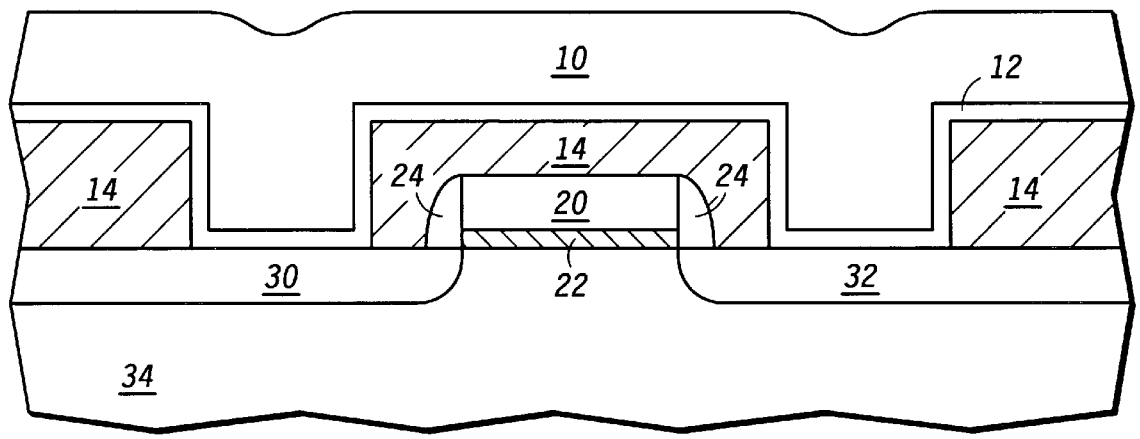
FIG. 1 includes an illustration of a cross-sectional view of a portion of a semiconductor substrate after forming plug fill materials over a semiconductor device substrate.

FIG. 1 includes an illustration of a portion of a semiconductor device substrate 34 before performing a polishing step. The semiconductor device substrate 34 includes doped regions 30 and 32. As used in this specification, the semiconductor device substrate 34 can be a monocrystalline semiconductor wafer, a semiconductor-on-insulator wafer, or any other substrate used to form semiconductor devices. In one embodiment, the semiconductor device substrate 34 is lightly p-type doped monocrystalline silicon, and the doped regions 30 and 32 are heavily n-type doped regions. A gate dielectric layer 22, a gate electrode 20, and sidewall spacers 24 overlie the semiconductor device substrate 34. An insulating layer 14 is formed over the substrate 34 and gate electrode 20. The insulating layer 14 includes openings to the doped regions 30 and 32. Although not shown in FIG. 1, other components are also formed and include diodes, resistors, capacitors, bipolar transistors, or the like.

An adhesion/barrier film 12 and a tungsten film 10 is formed over the insulating layer 14 and within the openings. In one embodiment, the adhesion/barrier film 12 includes titanium as an adhesion promoter and titanium nitride as a diffusion barrier.

The substrate 34 is placed within a polisher having a polishing pad. The polishing pad has different feature densities within different regions of the polishing pad. For example, in one polishing pad, the feature density is higher near the center of the polishing pad and lower near the edge of the polishing pad. Conversely, the feature density could be lower near the center of the polishing pad and higher near the edge. The feature density typically depends on the layers being polished.

In this particular embodiment, the adhesion/barrier film 12 and the tungsten film 10 are polished to remove those portions that overlie the insulating layer 14. The polishing characteristics of tungsten and titanium/titanium nitride are significantly different. The polishing characteristics of tungsten are such that it does not rely as heavily on the mechanical component of CMP compared to the chemical component of CMP. The titanium/titanium nitride film relies more heavily on the mechanical component of CMP.

Figure 2:
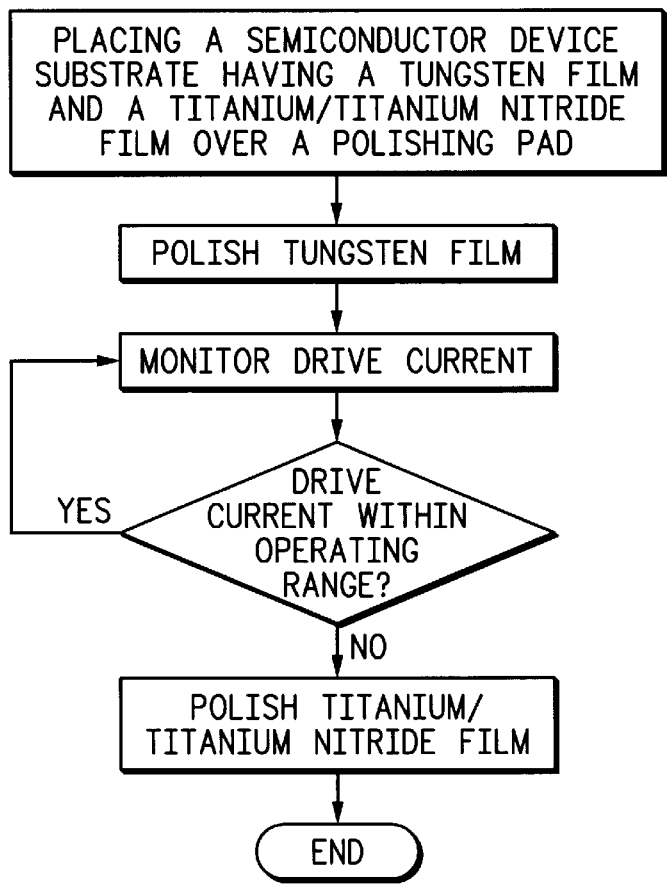
FIG. 2 includes a process flow diagram in accordance with one embodiment of the present invention.

The substrate is polished as shown in process flow diagram of FIG. 2. The substrate is placed on the polishing pad so that it overlies a first region of the polishing pad. For tungsten polishing, the first region is nearer the center of the polishing pad compared to the edge of the polishing pad. During the first portion of the polishing, the tungsten film is removed. During polishing the substrate holder vibrates and oscillates, the platen rotates, and the substrate holder rotates. Typically, the rotation of the platen and substrates are in the same direction. Additionally, a substrate downforce pressure is applied to the substrates. Conventional rotational speeds and down-force pressures are used.

As used in this specification, the difference between vibration and oscillation is that vibration occurs at a rate of at least ten cycles per second, and oscillation occurs at less than ten cycles per second. To draw an analogy to commonly known items, the vibration would be similar to movement seen with an orbital sander, and the oscillation motion would be typical of that seen with conventional oscillation motions used in the CMP. Unlike the prior art, vibration is used during polishing. Previously, no vibration was known to be used. The vibration helps to improve the uniformity by allowing adjustments to be made at a relatively microscopic level to help to increase the center of substrate polishing rate to be closer to the edge of substrate polishing rate.

In one embodiment, the process uses endpoint detection. In the prior art, numerous types of endpoint detecting systems are available for use in CMP. These include capacitance measurements, sonic measurements, and changes in friction between the polishing pad and the substrate. In this particular embodiment, the friction between the substrate and pad changes when the tungsten film is removed. More specifically, the amount of current being drawn by the motor used to rotate the substrate is at one level during the tungsten polishing. After the tungsten is removed during a first time period, the titanium/titanium nitride film causes more friction with the polishing pad. To keep the rotational speed for the substrate constant, the amount of current supplied to the motor increases. Therefore, the increase in current being drawn by the motor is the signal to tell the operator or machine that the titanium/titanium nitride film has been reached. The system can be configured to monitor the motor within the polisher for a change in drive force (i.e., motor current) needed to maintain a constant rotational speed.

Figure 3:
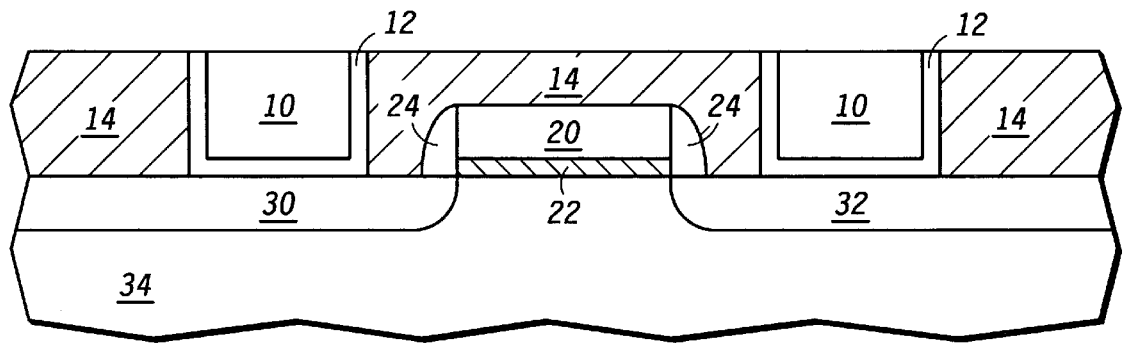
FIG. 3 includes an illustration of a cross-sectional view of the substrate of FIG. 1 after polishing the materials to form conductive plugs in accordance with one embodiment of the present invention.

After the endpoint signal is detected, the substrate is then moved to a second region within the polishing pad that is different from the first region. The second region typically has a different feature density, and the polishing is performed for a second time period using a different oscillation rate and different vibrating rate. In one particular embodiment, the feature density decreases near the edge of the pad, and the substrate itself is moved from one point nearer the center of the pad another point nearer the edge of the pad. The oscillation rate increases during the titanium/titanium nitride removal since the mechanical component needs to dominate more than with the tungsten removed. However, in other embodiments, each of the vibration rates or oscillation rates between the two steps can increase, decrease, or stay the same. The polishing then continues until the titanium/titanium nitride film is removed to give the device structure as shown in FIG. 3.

Figure 4:
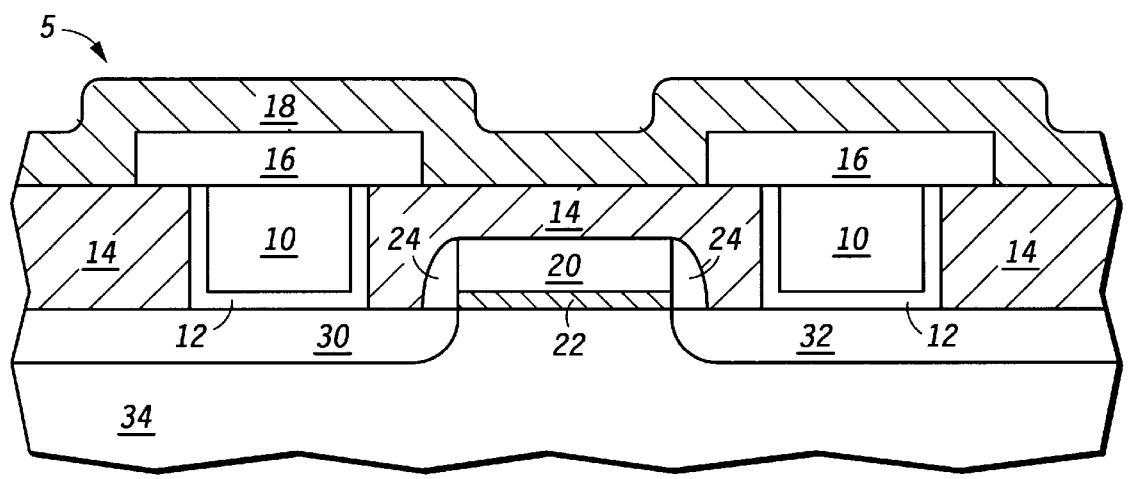
FIG. 4 includes an illustration of a cross-sectional view of the substrate of FIG. 3 after forming a substantially completed device.

Processing further continues to achieve the substantially completed semiconductor device 5 as shown in FIG. 4. After forming the conductive plugs, interconnects 16 are formed over the plugs followed by a passivation layer 18. Other interconnecting layers, insulating layers, conductive plugs, and the like are formed but are not shown in FIG. 4. Although not shown, an electrical contact is made to the gate electrode 20.

Many different embodiments can be used in practicing the present invention. The substrate has a center point that is moved from a point closer to the center of the polishing pad when removing the tungsten film 10 to a point closer to the edge of the polishing pad when polishing the titanium/titanium nitride film. In other embodiments, the order is reversed. The first portion of the polishing could occur closer to the edge of the polishing pad, and the second portion moves it closer to the center of the polishing pad. Throughout these different steps, the substrate remains over the polishing pad and is not removed from the polisher.

In other embodiments, other types of metal layers can be polished. An acidic slurry is typically used for metal polishing. In the case of the tungsten and titanium/titanium nitride films, the polishing slurry includes water, ferric nitrate ($Fe(NO_3)_3$), and alumina particles. The same polishing procedure can be used for polishing a single metal film or other types of layers that include a plurality of films such as an aluminum alloy film with an underlying titanium/titanium nitride film or a copper film with an underlying tantalum nitride or molybdenum film. In each of these cases, the tungsten, copper and aluminum typically are softer than the refractory metal nitrides that underlie those layers. Therefore, the multiple step polishing are highly beneficial to achieve better center to edge uniformity when polishing these materials.

Figure 5:
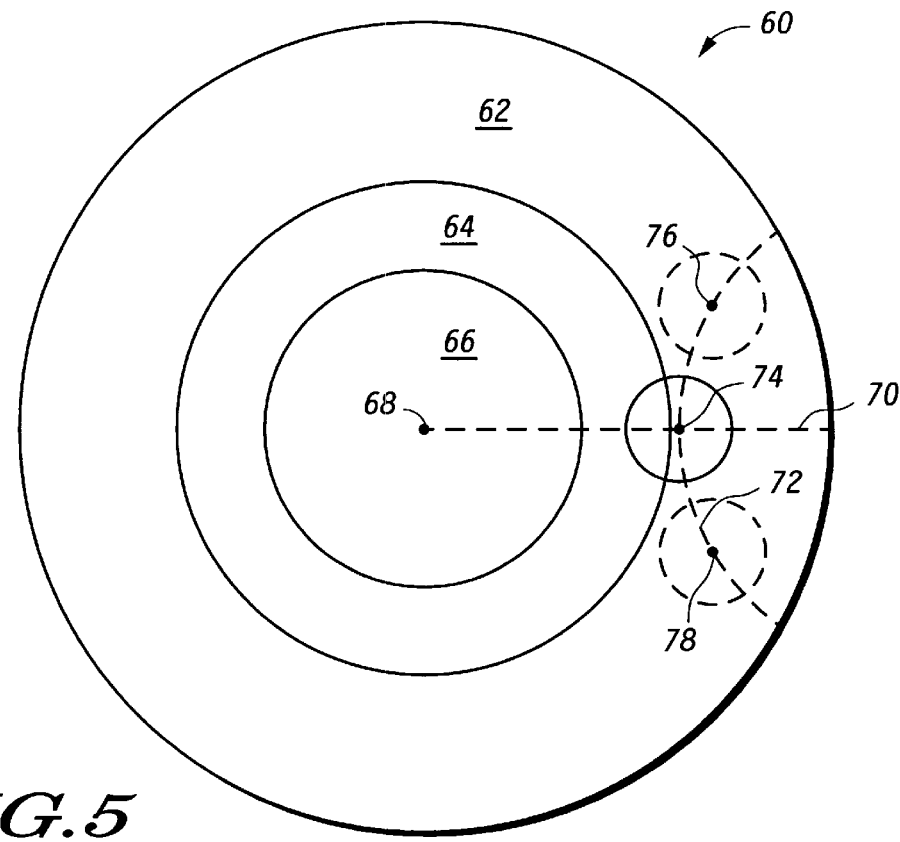
FIG. 5 includes an illustration of a top view of polishing pad and substrate showing positional relationships during the polishing of the substrates in accordance with one embodiment of the present invention.

The motions of the oscillation and vibration can be one of several different types. Vibration or oscillation typically occurs in a linear motion. The oscillation and vibration could both be in the same linear direction or could be in perpendicular or any other linear directions including diagonal with respect to each other. In FIG. 5, a polishing pad 60 has an outer region 62, a middle region 64, an inner region 66, and centerpoint 68 lying within the inner region 66. The feature density of region 66 is the lowest, and the feature density of region 62 is the highest. During tungsten polishing, the oscillation is in a linear direction along a portion of segment 70. The oscillation is performed such that the centerpoint of the substrate overlies only the inner region 66 or the middle and inner regions 64 and 66.

During titanium/titanium nitride polishing, the oscillation is in the shape of an arc 72. Points 74, 76, and 78 illustrate substrate centerpoint locations during the oscillating. The substrate centerpoint overlies the outer region 62 during this polishing step, although the edge of the substrate extends into the middle region 64.

Clearly, other types of motion are possible for oscillation or vibration. For example, the oscillation could be along a portion of segment 70, whereas the vibration may occur at an angle of 45 degrees or 135 degrees with respect to the oscillation motion. Many types of curved directions could be used including parabolas, arcs, circles, and even figure-eight patterns.

Figure 6:
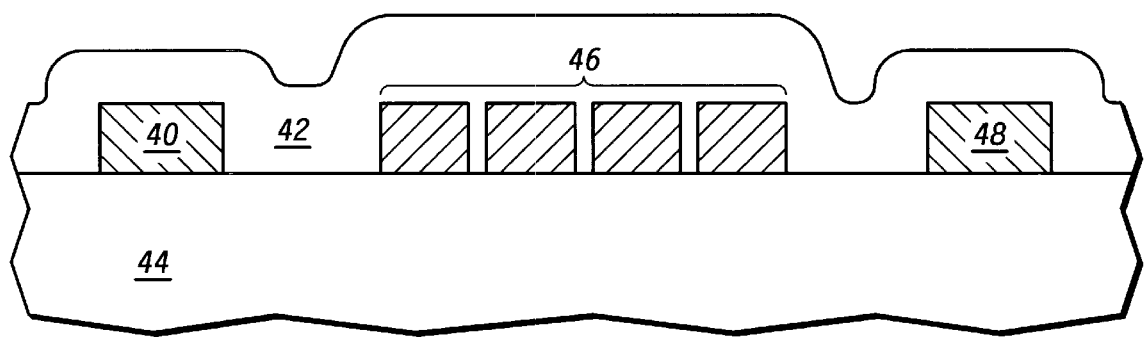
FIG. 6 includes an illustration of a cross-sectional view of a portion of semiconductor substrate after forming an insulating layer over the substrate.

The present invention is useful in helping to reduce non-uniformity between nested and isolated features over a semiconductor substrate. FIG. 6 includes an illustration of a semiconductor device substrate including an insulating layer 44, interconnects 40, 46, and 48, and an interlevel dielectric (ILD) layer 42. As illustrated in FIG. 6, the density of features is different for interconnects 46 than interconnects 40 and 48. When the ILD layer 42 is formed over these features, the density of the interconnects 46 is such that the insulating layer 44 fills in the gaps between the metal interconnects and forms an essentially uniform elevation for the upper surface of the ILD layer 42. ILD layer 42 typically includes an oxide, and in one embodiment, includes an undoped oxide film that underlies a doped oxide film.

The substrate is then placed into a polisher similar to the one previously described with respect to the tungsten and titanium/titanium nitride embodiment. The doped oxide film polishes at a higher rate compared to the undoped oxide. Therefore, the doped oxide film polishing is performed closer to the center of the polishing pad before moving out closer to the edge of the pad when polishing the undoped oxide. By doing this, the first portion of polishing has a stronger chemical component of the CMP than the second portion and that is used to polish the undoped oxide. The oscillation rates and vibration rates can be the same or different from those seen with the tungsten polishing embodiment. Unlike polishing tungsten, the slurry is basic and includes water, potassium hydroxide or ammonium hydroxide, and silica particles.

Figure 7:
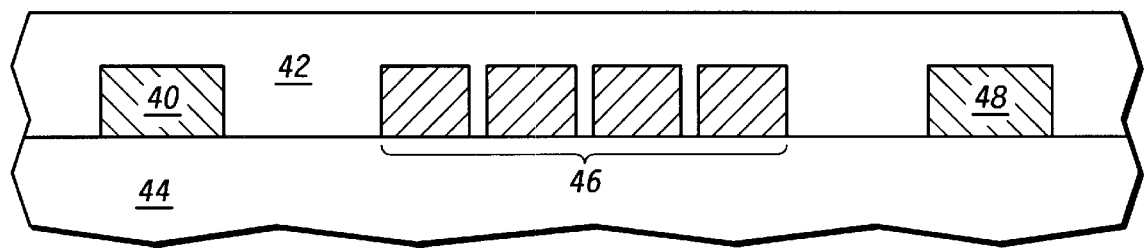
FIG. 7 includes an illustration of a cross-sectional view of the substrate of FIG. 6 after polishing the insulating layer in accordance with one embodiment of the present invention.

After polishing, the surface should be more planar than what is typically seen than in the prior art. More specifically, the thickness of the ILD layer 42 over the dense interconnects 46 should be closer to the same as it is over the isolated interconnects 40 and 48 as shown in FIG. 7. Still, some non-uniformity can occur. However, the adjustments of the vibrating and oscillating can occur throughout the polishing and be adjusted during polishing to achieve better planarity dynamically. The present invention is useful for insulating a variety of insulating layers including silicon oxynitride as well as just undoped or just doped films.

Embodiments of the present invention help to improve the center-to-edge polishing rate uniformity for substrates. By improving the polishing rate uniformity, the oxide thicknesses after polishing are more uniform between the center and the edge of a substrate. Subsequent processing steps should be more controllable. For example, a more controllable oxide etch process can be used to form contact or via openings that does not need as much overetch to make certain thicker oxide portions have contact openings formed. Therefore, there should be less damage to an underlying film or less via veils should be formed.

Additionally, the polishing rate with respect to metals allows the polishing to occur without eroding too much of the underlying insulating layer away. By doing this, the capacitance between an underlying feature, such as gate electrode or a different metal interconnect, and an overlying conductor is reduced. Therefore, higher speeds may be obtained from the part. Examples of semiconductor devices that benefit from such an improvement are typically memories and microprocessors that have very high circuit densities and run at very high operating speeds. The present invention may be used for other devices including microcontrollers, digital signal processors, and virtually any other semiconductor device.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A process for forming a semiconductor device comprising:

providing a semiconductor device substrate and a first layer over the semiconductor device substrate;

placing the semiconductor device substrate into a polisher having a polishing pad; and polishing the first layer for a first time period and a second time period, wherein:
the semiconductor device substrate oscillates a first oscillating rate during the first time period;
the semiconductor device substrate oscillates at a second oscillating rate during the second time period;
the second oscillating rate is different from the first oscillating rate; and
polishing during the first and second time periods is performed before forming a second layer over the first layer.

2. The process of claim 1, wherein the polishing pad has:

a first region having a first set of features with a first feature density; and a second region having a second set of features with a second feature density that is different from the first feature density.

3. The process of claim 2, wherein:

the second region lies closer to an edge of the polishing pad compared to the first region; and the second feature density is smaller than the first feature density.

4. The process of claim 2, further comprising:

receiving a signal that indicates an end of the first time period; and moving the semiconductor device substrate from the first region to the second region before the step of polishing the semiconductor device substrate for the second time period.

5. The process of claim 1, wherein the first layer has a first film and a second film overlying the first film, wherein the first and second films include dissimilar materials.

6. The process of claim 5, wherein:

the first film includes a barrier film; and the second film includes a metal.

7. The process of claim 5, wherein:

the first film includes an undoped insulating film; and the second film includes a doped insulating film.

8. The process of claim 1, further comprising forming the second over the first layer, wherein the second layer is a passivation layer.

* * * * *